United States Patent
Tonapi et al.

(10) Patent No.: US 7,550,097 B2
(45) Date of Patent: Jun. 23, 2009

(54) THERMAL CONDUCTIVE MATERIAL UTILIZING ELECTRICALLY CONDUCTIVE NANOPARTICLES

(75) Inventors: Sandeep Shrikant Tonapi, Niskayuna, NY (US); Hong Zhong, Schenectady, NY (US); Davide Louis Simone, Clifton Park, NY (US); Raymond Albert Fillion, Niskayuna, NY (US)

(73) Assignee: Momentive Performance Materials, Inc., Albany, NY (US)

( * ) Notice: Subject to any disclaimer, the term of this patent is extended or adjusted under 35 U.S.C. 154(b) by 1321 days.

(21) Appl. No.: 10/654,391

(22) Filed: Sep. 3, 2003

(65) Prior Publication Data

US 2005/0045855 A1    Mar. 3, 2005

(51) Int. Cl.
*H01B 1/22* (2006.01)
(52) U.S. Cl. ............. 252/512; 165/185; 106/1.18
(58) Field of Classification Search ............ 252/511, 252/512, 514; 165/185; 106/1.18–1.21
See application file for complete search history.

(56) References Cited

U.S. PATENT DOCUMENTS

| 5,026,748 | A | 6/1991 | Adams et al. |
| 5,695,872 | A | 12/1997 | Ideler et al. |
| 5,781,412 | A | 7/1998 | de Sorgo |
| 6,060,539 | A | 5/2000 | Hermansen et al. |
| 6,265,471 | B1 | 7/2001 | Dietz |
| 6,309,563 | B1* | 10/2001 | Iino et al. .............. 252/514 |
| 6,372,337 | B2* | 4/2002 | Takahashi et al. ........... 428/328 |
| 6,500,891 | B1 | 12/2002 | Kropp et al. |
| 7,013,965 | B2* | 3/2006 | Zhong et al. .............. 165/185 |
| 2003/0077478 | A1 | 4/2003 | Dani et al. |
| 2003/0151030 | A1* | 8/2003 | Gurin ..................... 252/502 |

FOREIGN PATENT DOCUMENTS

WO      0120676      9/2000

OTHER PUBLICATIONS

U.S. Appl. No. 10/426,485, filed Apr. 29, 2003.
Search Report Dated Feb. 7, 2005 for corresponding PCT application # PCT/US2004/025262.

* cited by examiner

*Primary Examiner*—Mark Kopec
(74) *Attorney, Agent, or Firm*—Joseph E. Waters

(57) ABSTRACT

Thermal interface compositions contain both non-electrically conductive micron-sized fillers and electrically conductive nanoparticles blended with a polymer matrix. Such compositions increase the bulk thermal conductivity of the polymer composites as well as decrease thermal interfacial resistances that exist between thermal interface materials and the corresponding mating surfaces. Such compositions are electrically non-conductive. Formulations containing nanoparticles also show less phase separation of micron-sized particles than formulations without nanoparticles.

26 Claims, 2 Drawing Sheets particle 18 to particle 18 contact area additional direct and multi-particle contact paths

THERMAL CONDUCTIVE MATERIAL UTILIZING ELECTRICALLY CONDUCTIVE NANOPARTICLES

BACKGROUND OF THE INVENTION

The present disclosure relates to the use of electrically conductive nanoparticles in combination with non-electrically conductive micron-sized fillers to enhance the thermal conductivity of polymer matrices.

Many electrical components generate heat during periods of operation. If this heat is not removed from the electrical component in an efficient manner, it will build up. Malfunction or permanent damage to the electrical components may then result. Therefore, thermal management techniques are often implemented within electrical circuits and systems to facilitate heat removal during periods of operation.

Thermal management techniques often involve the use of some form of heat sink to conduct heat away from high temperature areas in an electrical system. A heat sink is a structure formed from a high thermal conductivity material (e.g., typically a metal) that is mechanically coupled to an electrical component to aid in heat removal. In a relatively simple form, a heat sink can include a piece of metal (e.g., aluminum or copper) that is in contact with the electrical circuit during operation. Heat from the electrical circuit flows into the heat sink through the mechanical interface between the units.

In a typical electrical component, a heat sink is mechanically coupled to the heat producing component during operation by positioning a flat surface of the heat sink against a flat surface of the electrical component and holding the heat sink in place using some form of adhesive or fastener. As can be appreciated, the surface of the heat sink and the surface of the component will rarely be perfectly planar or smooth, so air gaps will generally exist between the surfaces. As is generally well known, the existence of air gaps between two opposing surfaces reduces the ability to transfer heat through the interface between the surfaces. Thus, these air gaps reduce the effectiveness and value of the heat sink as a thermal management device. To address this problem, polymeric compositions referred to as thermal interface materials or TIMs have been developed for placement between the heat transfer surfaces to decrease the thermal resistance therebetween. Many TIM applications, including those used with electrical components, require the TIM to be electrically insulating. Also in many TIM applications, the TIM must be sufficiently compliant to provide mechanical isolation of the heat generating component and the heat sink in those cases where the Coefficient of Thermal Expansion (CTE) of the component is significantly different (higher or lower) than that of the heat sink. The thickness and the material composition of the TIM can be restricted by the need for mechanical compliance. The minimum thickness of the TIM is determined by the degree of surface planarity on both the component and the heat sink.

The bulk thermal conductivity of current thermal interface materials is largely limited by the low thermal conductivity of polymer matrices (~0.2 W/m-K for polymers typically found in TIMs). In order to enhance their thermal conductivity, many TIM materials are filled with particles that have a higher thermal conductivity (>10 W/m-K). By some estimates ("Thermally Conductive Polymer Compositions," D. M. Bigg., Polymer Composites, June 1986, Vol. 7, No. 3), the maximum bulk thermal conductivity attainable by electrically insulating polymer composites is only 20-30 times that of the base polymer matrices. This number changes little regardless of the filler type, once the thermal conductivity of the filler exceeds 100 times that of the base polymer matrix. Consequently, the thermal conductivity of polymeric materials is low compared to the thermal conductivity of the heat sink, resulting in an inefficient transfer of heat from the heat producing component to the heat sink. In addition, effective heat transfer capability is further reduced by interfacial imperfections due to 1) micro or nanovoids, and 2) a filler-depleted layer caused by filler settlement or the inability of micron-sized filler to penetrate into surface irregularities that are smaller than the filler size.

While metals and other electrically conductive materials frequently are thermally conductive materials, for non-electrically conductive applications these higher performance materials either cannot be used in the TIM or they must be coated with a non-electrically conductive material, thereby adding cost, reducing thermal performance and potentially risking having openings in the non-electrically conductive coatings which could cause an electrical short. Thus, in most cases non-electrically conductive materials must be used, thereby limiting material choice and generally limiting thermal conductivity.

In addition to fillers, attempts to enhance the thermal conductivity of TIMs have included the use of nanoparticle materials. For example, U.S. patent application Ser. No. 10/426,485 discloses the use of non-electrically conductive nanoparticles in a polymer matrix to improve the thermal conductivity of a TIM system. However, for the reasons noted above, the choice of materials for use as the nanoparticles is limited.

In other electronic component applications where the heat generated during operation is lower, alternate thermal cooling approaches are utilized. These components often go into portable electronics such as lap top personal computers, cellular phones, digital assistants and electronic cameras. These components are often mounted onto a printed circuit board composed of a polymer material by means of an array of solder spheres. Reliability concerns with the integrity of the solder joints during normal thermal cycling due to environmental changes and due to power cycling, has lead to the use of resin underfill material that fills the gaps between the solder spheres under the electrical component. In many applications the prime thermal cooling path is from the component into the printed circuit board. Without any underfill or with an underfill that is a poor thermal conductor, the only thermal path from the component to the board is through the solder. The thermal performance can be improved by adding thermally conductive fillers to the underfill resin. In this application area, the resin can not be electrically conductive as it would short out the component I/O pads. Therefore underfill resins are limited to the use of electrically non-conducting fillers. As in the case of the TIM materials, this limits the thermal conductivity achievable. A need therefore exists for improved compositions to effectively transfer heat between a printed circuit board and a heat producing component in non-electrically conducting underfill materials.

A need therefore exists for improved compositions to effectively transfer heat between a heat sink and a heat producing component, especially in non-electrically conductive applications.

BRIEF DESCRIPTION OF THE INVENTION

Thermal interface compositions in accordance with this disclosure are polymer matrices containing both non-electrically conductive micron-sized filler particles and electrically conductive nanoparticles. The thermal interface materials in accordance with this disclosure are non-electrically conducting. The thermal interface composition can be used as a thermal interface material between a heat sink and electrical component or as an underfill material for electronic components found in portable electronic devices.

Electrical components are also described herein which include a heat producing component and a heat sink or heat spreader, each in contact with a thermal interface composition that contains both non-electrically conductive micron-sized filler particles and electrically conductive nanoparticles. In one embodiment the electrical component is a chip including a printed circuit board.

Methods of increasing the efficiency of heat transfer in accordance with this disclosure include the steps of interposing between a heat producing component and a heat sink or heat spreader a thermal interface composition that contains both non-electrically conductive micron-sized filler particles and electrically conductive nanoparticles. Where the heat producing component is a chip, the thermal interface composition is placed between the chip and a printed circuit board.

In another embodiment, methods of increasing the efficiency of heat transfer in accordance with this disclosure include, in applications where large particles are prohibited, the steps of interposing between a chip and a printed circuit board a thermal interface composition that contains electrically conductive nanoparticles.

DETAILED DESCRIPTION OF THE INVENTION

Figure 1:
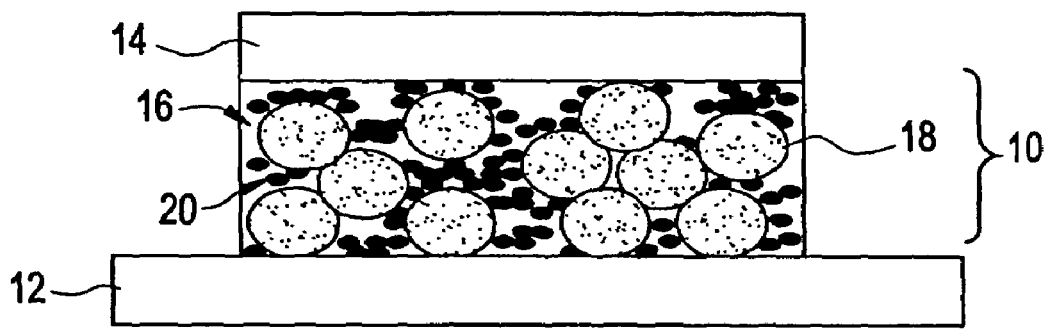
FIG. 1 is a cross-section of an electrically non-conductive TIM containing both micron-sized filler particles and electrically conductive nanoparticles.

The present disclosure provides a thermal interface composition containing both non-electrically conductive micron-sized filler particles and electrically conductive nanoparticles in a polymer matrix. The electrically conductive nanoparticles are used to increase the thermal conductivity of the thermal interface composition. As used herein, a "thermal interface composition" is any material useful in conducting heat away from high temperature areas in an electrical system and can include a thermal interface material ("TIM") placed between a heat sink and a heat generating component of an electrical device or an underfill material utilized in integrated circuit packages, i.e., chips, to fill gaps between the chip and substrate and improve fatigue life of solder used in the chips by removing heat generated during thermal cycling. The present disclosure also provides a thermal interface composition containing electrically conductive nanoparticles in a polymer matrix without non-electrically conductive micron-sized filler particles which are especially suitable for use in applications where micron-sized particles can not be used because of mechanical or optical requirements. These applications include, but are not limited to, no-flow underfill applications where micron-sized or larger particles have been found to cause solder joint defects; wafer-level underfill applications where a clear resin is required for wafer sawing; and in the mounting of photonic devices where the optical properties of the resultant material would prohibit micron sized particles.

The thermal interface composition itself is electrically non-conducting. Matrices containing non-electrically conductive micron-sized filler particles and electrically conductive nanoparticles in accordance with the present disclosure can achieve higher thermal conductivity than a comparable blend of non-electrically conductive micron-sized filler particles and matrices alone. The nanoparticles thus increase the bulk thermal conductivity of the matrix, while maintaining a viscosity that allows easy processing and manipulation. Furthermore, nanoparticles can penetrate into surface pores and irregularities inaccessible to micron-sized fillers, thereby reducing the effects of interfacial resistance.

The organic matrix utilized in the present disclosure can be any polymeric material, including curable and non-curing matrices. Suitable organic matrices include, but are not limited to, polydimethylsiloxane resins, epoxy resins, acrylate resins, other organo-functionalized polysiloxane resins, polyimide resins, fluorocarbon resins, benzocyclobutene resins, fluorinated polyallyl ethers, polyamide resins, polyimidoamide resins, phenol resol resins, aromatic polyester resins, polyphenylene ether (PPE) resins, bismaleimide triazine resins, fluororesins and any other polymeric systems known to those skilled in the art. (For common polymers, see "Polymer Handbook:, Branduf, J.; Immergut, E. H; Grulke, Eric A; Wiley Interscience Publication, New York, $4^{th}$ ed.(1999); "Polymer Data Handbook Mark, James Oxford University Press, New York (1999)).

Preferred curable polymer matrices are acrylate resins, epoxy resins, polydimethylsiloxane resins and other organo-functionalized polysiloxane resins that can form cross-linking networks via free radical polymerization, atom transfer, radical polymerization, ring-opening polymerization, ring-opening metathesis polymerization, anionic polymerization, cationic polymerization or any other method known to those skilled in the art. Suitable curable silicone resins include, for example, the addition curable and condensation curable matrices as described in "Chemistry and Technology of Silicone", Noll, W.; Academic Press 1968.

Where the polymer matrix is not a curable polymer, the resulting thermal interface composition can be formulated as a gel, grease or phase change material that can hold components together during fabrication and thermal transfer during operation of the device.

The second component of the composition of the present disclosure is a plurality of at least one micron-sized filler. The micron-sized fillers are thermally conductive materials, and can be reinforcing or non-reinforcing. Suitable micron-sized fillers include fumed silica, fused silica, finely divided quartz powder, amorphous silicas, carbon black, graphite, diamond, aluminum hydrates, metal nitrides (such as boron nitride, aluminum nitrides, and silica coated aluminum nitride), metal oxides (such as oxides of aluminum, magnesium, zinc, titanium, zirconium, beryllium, or iron) and combinations thereof. The filler is typically present in a range between about 10 weight % and about 95 weight %, based on the weight of the total final composition. More typically, the filler is present in a range between about 30 weight % and about 90 weight %, based on the weight of the total final dispersion composition.

Particles of the micron-sized filler can range from about 1 to about 100 microns in size, with a range of from about 10 to about 50 microns being preferred. The selection of the micron-sized filler size is established by the targeted bond line thickness in its end use application, typically about 10 to about 150 microns. The filler particles should have dimensions less than the cured thickness of the thermal interface composition in which it is used.

The third component of the compositions of the present disclosure is electrically conductive nanoparticles. The electrically conductive nanoparticles utilized in accordance with the present disclosure can be composed of a metal such as copper, silver, gold, platinum, palladium, graphite or aluminum, or semiconducting material such as doped silicon or silicon carbide. The electrically conductive nanoparticles used in accordance with the present disclosure do not require a non-electrically conductive coating on their surfaces.

Where utilized in thermal interface compositions possessing micron-sized filler, the electrically conductive nanoparticles are typically present in a range between about 3 weight % and about 50 weight %, based on the weight of the total final composition, with a range of from about 10% to about 30% by weight being preferred. This corresponds to a range of from about 1% to about 25% by volume of the thermal interface composition, with a range of about 2% to about 15% by volume of the total final composition being preferred.

Where utilized in thermal interface compositions applications where micron-sized particles can not be used because of mechanical or optical requirements, the electrically conductive nanoparticles are typically present in a range between about 10 weight % and about 85 weight %, based on the weight of the total final composition, with a range of from about 50% to about 75% by weight being preferred.

Preferably, the electrically conductive nanoparticles are of a size ranging from about 1 to about 250 nanometers, with a range of from about 10 to about 100 nanometers being preferred.

While the thermal interface compositions of the present disclosure, such as TIMs, are well-suited for use in non-electrically conductive applications, the compositions of the present disclosure may also be used in resin systems for non-TIM applications that are required to be non-electrically conductive but require modification of another material property, such as thermal conductivity, modulus, dielectric constant, or index of refraction. Such materials include moldings, overmoldings, underfills, wafer level underfills, non-flow underfills and interposers.

While the addition of micron-sized fillers can increase the thermal conductivity of the composition substantially, the effect of the micron-sized fillers on the thermal conductivity of the polymeric matrix is multiplied greatly by the addition of the electrically conductive nanoparticles. The electrically conductive nanoparticles in the areas where one micron-sized particle touches or is in close proximity to another micron-sized particle thermally connect one micron-sized particle to another. This creates multiple thermal paths between the micron-sized particles that are in parallel with, and add to, the direct conductive thermal paths between them. Thus, the thermal coupling between particles and from particles to the surfaces is enhanced.

By way of example, if a polymeric matrix such as an epoxy aramid with a thermal conductivity of about 0.12 W/m-K, has an 80-90 wt % of a suitable micron-sized filler added, it can have its thermal conductivity raised to about 2.0 W/m-K. However, by adding 20-40 wt % of electrically conductive nanoparticles in accordance with this disclosure, the initial thermal conductivity of the polymeric matrix can be raised to 0.4-0.6 W/m-K, a 3×-5× increase compared to compositions lacking the nanoparticles. Thus, for example, where the thermal interface composition is a TIM, the subsequent addition of 70-80 wt % of suitable micron-sized filler to the resin with the nanoparticles result in a TIM with 4.0-6.0 W/m-K, a 2×-3× increase over the TIM without nanoparticles. The addition of micron-particles alone to reach a similar high thermal conductivity will result in a composition that is very viscous, not easily processed and which will not flow as necessary for preparation of electronic devices, especially semiconductor chips, including flip/chip devices. Further, a high weight % loading of electrically conductive nanoparticles, such as in the 80-90% range would likely result in an electrically conductive TIM. Using electrically conductive nanoparticles in accordance with the present disclosure on the other hand provides increased thermal conductivity without significantly raising the filled resin viscosity to the point where it will have insufficient flow properties to be commercially usable while maintaining electrical isolation.

In the compositions of the present disclosure, the micron particles are about 100 to 5000 times larger than the nanoparticles. Thus, the TIMs in accordance with the present disclosure have bond lines possessing a thickness ranging from about 10 to about 150 microns, with a range of from about 20 to about 70 microns being more preferred.

In accordance with the present disclosure, the electrically conductive nanoparticles typically have a higher thermal conductivity than non-conductive nanoparticles (coated or uncoated) and have a lower manufacturing cost than coated nanoparticles. Phase separation between filler and resin is less likely to occur, offering longer shelf life and product stability.

The micron-sized filler and electrically conductive nanoparticles are combined with the organic matrix to form the present compositions. To facilitate combining the nanoparticles and micron-sized filler with the organic matrix, one or more solvents can be optionally added to the composition. Suitable solvents include, but are not limited to, isopropanol, 1-methoxy-2-propanol, 1-methoxy-2-propyl acetate, toluene, xylene, n-methyl pyrrolidone, dichlorobenzene and combinations thereof.

The manner in which the nanoparticles and micron-sized filler are combined with the organic matrix is not critical.

The composition can be treated with acid or base or with ion exchange resins to remove acidic or basic impurities. This composition can advantageously be subjected to vacuum in a range between about 0.5 Torr and about 250 Torr and at a temperature in a range between about 20° C. and about 140° C. to substantially remove any low boiling components such as solvent, residual water, and combinations thereof. The result is a dispersion of nanoparticles and micron-sized filler in an organic matrix, herein referred to as a final dispersion or final composition. Substantial removal of low boiling components is defined herein as removal of at least about 90% of the total amount of low boiling components.

The presence of nanoparticles in the present compositions also improves the stability of the composition when micron-sized fillers are present. The nanoparticles prevent or decrease the rate of micron-sized filler settlement, thus reducing the likelihood of the formation of a filler-depleted layer in the interface material. Thus, the electrically conductive nanoparticles of the thermal interface compositions of the present disclosure may be also used to slow the phase separation of a polymer composition containing a micron-sized filler A polymer composition is formed by providing a polymer matrix and blending a micron-sized filler therewith to form the polymer composition and then blending the electrically conductive nanoparticles with the polymer composition.

The compositions of the present disclosure may also include other additional materials. For example, a curing catalyst can be added to the final dispersion to accelerate curing of the final composition. Typically, the catalyst is present in a range between about 10 parts per million (ppm) and less than about 2% by weight of the total curable composition. Examples of cationic curing catalysts include, but are not limited to, onium catalysts such as bisaryliodonium salts (e.g. bis(dodecylphenyl)iodonium hexafluoroantimonate, (octyloxyphenyl, phenyl)iodonium hexafluoroantimonate, bisaryliodonium tetrakis(pentafluorophenyl)borate), triarylsulphonium salts, and combinations thereof. Examples of radical curing catalysts, include, but are not limited to various peroxides (e.g. tert-butyl peroxy benzoate), azo compounds (e.g. 2-2'-azo bis-isobutyl nitrile) and nitroxides (e.g. 4-hydroxy-2,2,6,6-tetramethylpiperidinyloxy (i.e. 4-hydroxy TEMPO). For addition curable silicone resins, the preferred catalysts are various Group 8-10 transition metals (e.g., ruthenium, rhodium, platinum) complexes. For condensation curable silicones, the preferred catalysts are organo-tin or organo-titanium complexes. Detailed structures of the catalysts are known to those skilled in the art.

Optionally, for cationic curable polymer matrices, an effective amount of a free-radical generating compound can be added as the optional reagent. Suitable free-radical generating compounds include aromatic pinacols, benzoin alkyl ethers, organic peroxides, and combinations thereof. The free radical generating compound facilitates decomposition of onium salt at lower temperatures.

For epoxy resins, hardeners such as carboxylic acid-anhydride curing agents and an organic compound containing a hydroxyl moiety can be added as optional reagents with the curing catalyst. In these cases, curing catalysts may be selected from, but are not limited to, amines, alkyl-substituted imidazole, imidazolium salts, phosphines, metal salts, triphenyl phosphine, alkyl-imidazole, aluminum acetyl acetonate and combinations thereof. Curing agents such as multi-functional amines can be optionally incorporated as cross-linking agents. Exemplary amines include, but are not limited to, ethylene diamine, propylene diamine, 1,2-phenylenediamine, 1,3-phenylene diamine, 1,4-phenylene diamine, and any other compounds containing 2 or more amino groups.

For epoxy resins, exemplary anhydride curing agents typically include methylhexahydrophthalic anhydride, 1,2-cyclohexanedicarboxylic anhydride, bicyclo[2.2.1]hept-5-ene-2,3-dicarboxylic anhydride, methylbicyclo[2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and the like. Combinations comprising at least two anhydride curing agents may also be used. Illustrative examples are described in "Chemistry and Technology of the Epoxy Resins" B. Ellis (Ed.) Chapman Hall, New York, 1993 and in "Epoxy Resins Chemistry and Technology", edited by C. A. May, Marcel Dekker, New York, 2nd edition, 1988.

For addition curable silicone resins, cross-linking agents such as multi-functional Si—H containing silicone fluids can be incorporated, so that the Si—H to vinyl molar ratio in the final formulation ranges between 0.5-5.0 and preferably between 0.9-2.0.

For addition curable silicone resins, inhibitors can be optionally included to modify the curing profile and achieve the desired shelf life. Inhibitors include but are not limited to, phosphine compounds, amine compounds, isocyanurates, alkynyl alcohol, maleic esters and any other compounds known to those skilled in the art.

Reactive organic diluents may also be added to the total curable composition to decrease the viscosity of the composition. Examples of reactive diluents include, but are not limited to, 3-ethyl-3-hydroxymethyl-oxetane, dodecylglycidyl ether, 4-vinyl-1-cyclohexane diepoxide, di(Beta-(3,4-epoxycyclohexyl)ethyl)-tetramethyldisiloxane, various dienes (e.g., 1,5-hexadiene), alkenes (e.g., n-octene), styrenic compounds, acrylate or methacrylate containing compounds (e.g., methacryloxypropyltrimethoxysilane) and combinations thereof. A non-reactive diluent may also be added to the composition to decrease the viscosity of the formulation. Examples of non-reactive diluents include, but are not limited to, low boiling aliphatic hydrocarbons (e.g., octane), toluene, ethyl acetate, butyl acetate, 1-methoxypropyl acetate, ethylene glycol, dimethyl ether, and combinations thereof.

Adhesion promoters can also be added to the final dispersion and include trialkoxyorganosilanes (e.g., γ-aminopropyltrimethoxysilane, 3-glycidoxypropyltrimethoxysilane, bis (trimethoxysilylpropyl)fumarate), which are used in an effective amount typically in a range between about 0.01% by weight and about 2% by weight of the total final dispersion.

Flame retardants can be optionally added to the final dispersion in a range between about 0.5 weight % and about 20 weight % relative to the amount of the total final composition. Examples of flame retardants include phosphoramides, triphenyl phosphate (TPP), resorcinol diphosphate (RDP), bisphenol-a-disphosphate (BPA-DP), organic phosphine oxides, halogenated epoxy resin (tetrabromobisphenol A), metal oxide, metal hydroxides, and combinations thereof.

Other non-electrically conductive nanoparticles having a thermal conductivity higher than the organic matrix can also be used in conjunction with the electrically conductive nanoparticles to prepare the present compositions. Suitable additional non-electrically conductive nanoparticles include, but are not limited to, colloidal silica, polyhedral oligomeric silsesquioxane ("POSS"), nano-sized metal oxides (e.g. alumina, titania, zirconia), and nano-sized metal nitrides (e.g. boron nitrides, aluminum nitrides). In particularly useful embodiments, the additional nanoparticles are functionalized to enhance their integration in the organic matrix and include, e.g., organo-functionalized POSS materials or colloidal silica. The particle size of the colloidal silica is typically in a range between about 1 nanometers ("nm") and about 250 nm, and more typically in a range between about 5 nm and about 150 nm.

The final composition can be hand-mixed or mixed by standard mixing equipment such as dough mixers, chain can mixers, planetary mixers, twin screw extruder, two or three roll mill and the like. The blending of the components of the composition can be performed in batch, continuous, or semi-continuous mode by any means used by those skilled in the art.

The curing process can be performed by any process known to those skilled in the art. Curing can be done by methods such as thermal cure, UV light cure, microwave cure, e-beam cure and combinations thereof. Curing typically occurs at a temperature in a range between about 20° C. and about 250° C., more typically in a range between about 20° C. and about 150° C. Curing typically occurs at a pressure in a range between about 1 atmosphere ("atm") and about 5 tons pressure per square inch, more typically in a range between about 1 atmosphere and about 100 pounds per square inch ("psi"). In addition, curing may typically occur over a period in a range between about 30 seconds and about 5 hours, and more typically in a range between about 90 seconds and about 60 minutes. Optionally, the cured composition can be post-cured at a temperature in a range between about 100° C. and about 150° C. over a period in a range between about 1 hour and about 4 hours.

The addition of electrically conductive nanoparticles is used to increase the bulk thermal conductivity of base polymer matrix to provide improved thermal conductivity when placed between any two objects, especially for non-electrically conductive applications, such as between parts of an electrical component. In addition, the present thermal interface compositions reduce the interfacial resistance to heat flow that is inherently present at the surfaces of any two components between which heat is to be transferred. The present thermal interface compositions can be used in devices in electronics such as computers, semiconductors, or any device where heat transfer between components is needed.

In one embodiment, the electronic component includes a semiconductor chip as a heat producing component. In such a case, the heat producing component can be a chip carrier, an area array package, a chip scale package, or other semiconductor packaging structure. In other embodiments the semiconductor chip itself is the heat producing component.

Application of the present thermal interface compositions may be achieved by any method known in the art. Conventional methods include screen printing, stencil printing, syringe dispensing and pick-and-place equipment.

In another aspect, the present compositions can be formed into sheets and cut into any desired shape. In this embodiment, the compositions can advantageously be used to produce pre-formed thermal interface pads that can be positioned between electronic components.

The present disclosure will now be described in greater detail with respect to the accompanying figures. FIG. 1 is a cross-section of an electrically non-conductive TIM 10 in accordance with the present disclosure. The TIM is placed between an electronic device 12 and a heat sink/heat spreader 14. The TIM material is a polymeric resin 16, such as an epoxy or silicone based material, which also contains multiple electrically non-conductive micron-sized particles 18 and smaller, electrically conductive nanoparticles 20. The TIM, which typically has a bond line thickness of about 10 to about 150 microns, preferably about 20 to about 70 microns, fills any air gaps and facilitates heat transfer.

Figure 2:
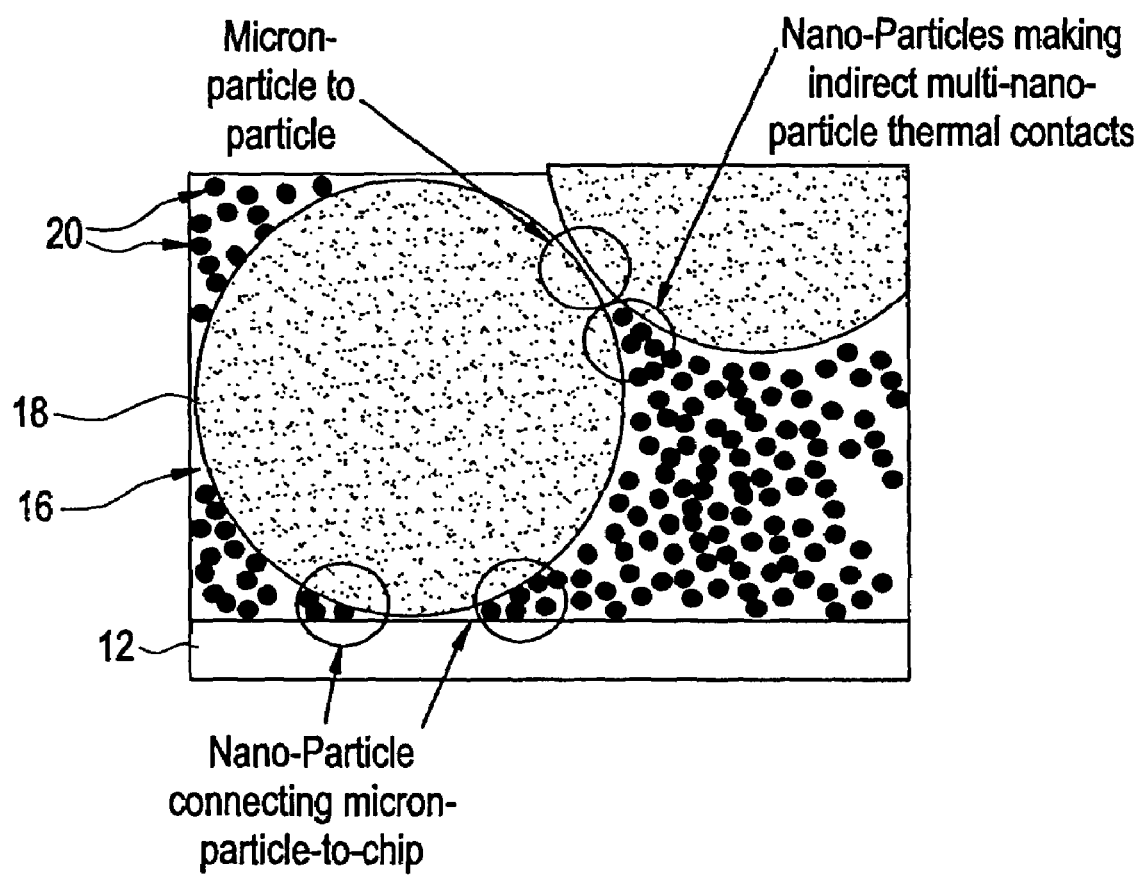
FIG. 2 is an enlarged view of a portion of FIG. 1 showing how electrically conductive nanoparticles improve thermal conductivity between micron-sized filler particles and an electronic device.

FIG. 2 is an enlargement of the cross-sectional view of the TIM system depicted in FIG. 1. This figure depicts two micron-sized filler particles 18 and numerous electrically conductive nanoparticles 20. It highlights the interface regions between one micron-sized filler particle 18 and the device surface 12 and between the two micron-sized filler particles. The electrically conductive nanoparticles are present in these interface regions as well as within the bulk areas of the resin 16. An important thermal improvement in this TIM system is the improved thermal conduction effects in the three interface regions: the micron-sized filler particle 18 to electronic device 12 surface region; the micron-sized filler particle 18 to micron-sized filler particle 18 region; and the micron-sized filler particle 18 to heat sink/heat spreader 14 surface region (not shown).

Figure 3:
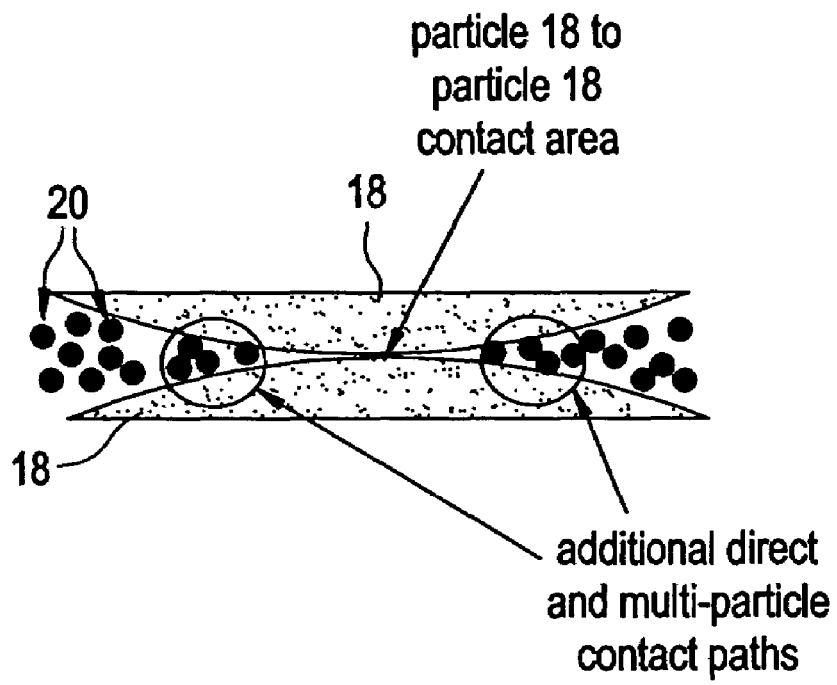
FIG. 3 is an enlarged portion of a cross-section of a TIM showing electrically conductive nanoparticles improving thermal conductivity between micron-sized filler particles.

FIG. 3 is a cross-section of an enlarged portion of a TIM showing electrically conductive nanoparticles 20 and their ability to improve micron-sized particle 18 to micron-sized particle 18 thermal conductivity. The electrically conductive nanoparticles in the areas where one micron-sized particle touches or is in close proximity to another micron-sized particle thermally connect one micron-sized particle to another. This creates multiple thermal paths between the micron-sized particles 18 that are in parallel with, and add to, the direct conductive thermal paths between them. As long as the micron-sized particles are electrically non-conductive, the electrically conductive nanoparticles will not cause an electrically conductive path from the device to the substrate.

However, while it is theoretically possible for the orientation of nanoparticles to form a long string of electrically conductive nanoparticles creating a direct electrical connection through the TIM bond line, the combination of the amounts and sizes of the particles in the TIM render such an orientation in fact impossible. When one considers the targeted TIM thickness (in the range of 10 to 150 microns, the amount of nanoparticles in the TIM (from about 3 to about 50% by weight and 1-25% by volume), and the preferred nanoparticle size (10 to 100 nanometers), in order for the TIM to be electrically conductive, a string of 200 to 5000 electrically conductive nanoparticles all touching in a continuous path would have to be able to reach from the electronic device 12 surface to the heat sink/heat spreader 14 surface. As will readily be appreciated by one skilled in the art, it would be impossible for the electrically conductive nanoparticles to form a continuous electrical path and thus an electrical connection between the electronic device 12 and the heat sink/heat spreader 14 especially where micron-sized, non-electrically conductive particles are present which will inevitably interrupt the short electrical conduction pathway formed by the electrically conductive nanoparticles, leading to an overall electrically insulating connection.

In another embodiment, the compositions of the present disclosure can be used in electronic components as underfill materials. In this embodiment, electrically conductive nanoparticles are added to a polymeric resin that also contains electrically non-conductive micron-sized particles wherein the resulting matrix system is electrically non-conducting and is used as an underfill material for electronic components. The components utilize solder spheres for electrically connecting the component to a printed circuit board. In such a case, application of the composition of the present disclosure is generally after assembly and solder reflow of a component onto the printed circuit board. Alternatively, the underfill resin can be applied to the board prior to component placement. In this process, the solder is reflowed as the resin is cured. Another alternative approach involves the application of the thermally conductive underfill resin to a semiconductor wafer that contains multiple electronic components and arrays of solder spheres. Following wafer sawing to separate each component, the component is mounted onto a printed circuit board. In this process, the solder is reflowed as the resin is cured.

Figure 4:
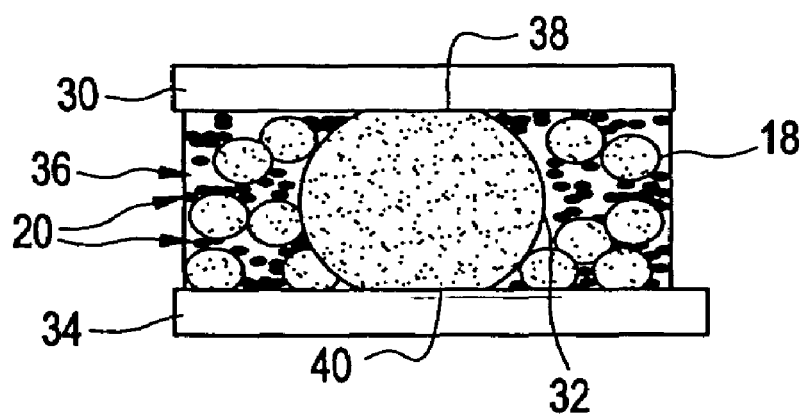
FIG. 4 is an enlarged portion of a cross-section of an electrically insulating underfill material utilizing electrically conductive nanoparticles to improve thermal conductivity between micron-sized filler particles.

FIG. 4 is a cross-section of an enlarged portion of a heat generating component 30 electrically connected by solder sphere 32 onto a printed circuit board 34 with thermally conductive underfill 36 encapsulating the component surface 38, the board surface 40 and the solder sphere 32. The thermally conductive resin 16 contains both electrically conductive nanoparticles 20 and electrically non-conductive micron-sized particles 18. The thermally conductive underfill fills a gap of 50 to 500 microns between the component and the board.

In yet another embodiment, the electrically conductive nanoparticles are added to a polymeric resin that contains no micron-sized particles wherein the resulting matrix system is electrically non-conducting and the resin is used as an underfill material for electronic components that utilize solder spheres for electrically connecting the component to a printed circuit board. These applications include, but are not limited to, no-flow underfill applications where micron-sized or larger particles have been found to cause solder joint defects; wafer-level underfill applications where a clear resin is required for wafer sawing; and in the mounting of photonic devices where the optical properties of the resultant material would prohibit micron sized particles.

Methods for increasing heat transfer in accordance with the present disclosure include positioning a heat producing component in contact with an electrically non-conducting thermal interface composition comprising a blend of a polymer matrix, at least one micron-sized filler, and electrically conductive nanoparticles and positioning a heat sink in contact with the thermal interface composition. Where the electronic component is a chip, the heat producing component is placed in contact with a printed circuit board, and an electrical connection is formed between the component and at least one electrical contact of the printed circuit board. A thermal interface composition, which includes a blend of a polymer matrix, at least one micron-sized filler and electrically conductive nanoparticles, is applied between the component and the print circuit board so that the thermal interface composition encapsulates the at least one electrical connection. In an alternate embodiment, the thermal interface composition utilized to encapsulate the at least one electrical connection includes a blend of a polymer matrix and electrically conductive nanoparticles.

In another embodiment, a method for increasing heat transfer includes applying a thermal interface composition in accordance with the present disclosure to a semiconductor wafer containing a plurality of die sites, said die sites containing a plurality of electrical contacts and then disposing at least one solder sphere onto said plurality of contacts. The thermal interface composition is partially cured such that a top of the at least one solder sphere is exposed, after which time the wafer is sawed into individual semiconductor chips. The individual chips are then positioned onto a printed circuit board such that the at least one solder sphere is aligned to form at least one electrical connection with at least one electrical contact of the printed circuit board. The component and board are then heated to concurrently melt the solder sphere and cure the thermal interface composition, after which they are cooled to solidify the solder sphere and set the thermal interface composition so that the thermal interface composition encapsulates the at least one electrical connection.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

The invention claimed is:

1. A thermal interface composition, comprising:
   a blend of a polymer matrix, wherein the polymer matrix comprises a curable polymeric composition,
   at least one micron-sized filler, and
   nanoparticles that are electrically conductive relative to the micro-sized filler,
   wherein the thermal interface composition is thermally conducting and electrically non-conducting.

2. A thermal interface composition as in claim 1, wherein the curable polymeric composition is selected from the group consisting of epoxy resins, acrylate resins, polyimide resins, polyimide resins, fluorocarbon resins, benzocyclobutene resins, and fluorinated polyallyl ethers, polyamide resins, polyimidoamide resins, cyanate ester resins, phenol resol resins, aromatic polyester resins, polyphenylene ether (PPE) resins, bismaleimide triazine resins, and fluororesins.

3. A thermal interface composition as in claim 1 wherein the micron sized filler is selected from the group consisting of fumed silica, fused silica, finely divided quartz powder, amorphous silicas, carbon black, graphite, diamond, aluminum hydrates, metal nitrides, metal oxides, and combinations thereof.

4. A thermal interface composition as in claim 1 wherein the micron-sized filler is present in an amount in a range of from about 10 weight % to about 95 weight % of the total composition.

5. A thermal interface composition as in claim 1 wherein the micron-sized filler comprises particles of a size in a range of from about 1 micron to about 100 microns.

6. A thermal interface composition as in claim 1, wherein the electrically conductive nanoparticles are selected from the group consisting of copper, silver, platinum, palladium, gold, graphite, aluminum, doped silicon and silicon carbide.

7. A thermal interface composition as in claim 1 wherein the electrically conductive nanoparticles are present in an amount in a range of from about 3 weight % to about 50 weight % of the total composition.

8. A thermal interface composition as in claim 1 wherein the electrically conductive nanoparticles are present in an amount in a range of from about 1% to about 25% by volume of the total composition.

9. A thermal interface composition as in claim 1, wherein the electrically conductive nanoparticles are of a size in a range of from about 1 nanometer to about 250 nanometers.

10. A thermal interface composition as in claim 1, further comprising organo-functionalized nanoparticles.

11. A thermal interface composition as in claim 10, wherein the organo-functionalized nanoparticles comprise an organoalkoxysilane, vinyl, allyl, styrenic, silyl or siloxyl of the formula $(R^1)_a Si(OR^2)_{4-a}$ wherein $R^1$ is independently at each occurrence a $C_{1-18}$ monovalent hydrocarbon radical; $R^2$ is independently at each occurrence a $C_{1-18}$ monovalent hydrocarbon radical or a hydrogen radical; and "a" is a whole number in a range of from 1 to 3 inclusive.

12. A thermal interface composition as in claim 1 having a thickness in a range of from about 10 to about 150 microns.

13. A cured layer formed from the thermal interface composition as defined in claim 1.

14. An electronic component comprising the cured layer as defined in claim 13, wherein the cured layer is an underfill layer that secures a heat producing component to a printed circuit board.

15. An electronic component as defined in claim 14, wherein the cured underfill layer is electrically non-conducting.

16. An electronic component as defined in claim 13, wherein the cured layer is selected from the group consisting of epoxy resins, acrylate resins, organopolysiloxane resins, polyimide resins, polyimide resins, fluorocarbon resins, benzocyclobutene resins, and fluorinated polyallyl ethers, polyamide resins, polyimidoamide resins, cyanate ester resins, phenol resol resins, aromatic polyester resins, polyphenylene ether (PPE) resins, bismaleimide triazine resins, and fluororesins.

17. An electronic component as defined in claim 13, wherein the wherein the micron-sized filler comprises one or more of aluminum hydrates, metal nitrides, or metal oxides.

18. An electronic component as defined in claim 13, wherein the micron-sized filler is present in an amount in a range of from about 10 weight percent to about 95 weight percent of the total composition.

19. An electronic component as defined in claim 13, wherein the micron-sized filler comprises particles having a size in a range of from about 1 micron to about 100 microns.

20. An electronic component as defined in claim 13, wherein the electrically conductive nanoparticles comprise one or more of copper, silver, platinum, palladium, gold, graphite, aluminum, or silicon.

21. An electronic component as defined in claim 13, wherein the electrically conductive nanoparticles are present in an amount in a range of from about 3 weight percent to about 50 weight percent of the total composition.

22. An electronic component as defined in claim 13, wherein the electrically conductive nanoparticles are present in an amount in a range of from about 1 percent to about 25 percent by volume of the total composition.

23. An electronic component as defined in claim 13, wherein the electrically conductive nanoparticles have a size in a range of from about 1 nanometer to about 250 nanometers.

24. An electronic component as defined in claim 13, further comprising organo-functionalized nanoparticles.

25. An electronic component as defined in claim 24, wherein the organo-functionalized nanoparticles comprise an organoalkoxysilane, vinyl, allyl, styrenic, silyl or siloxyl of the formula $(R^1)_a Si(OR^2)_{4-a}$ wherein $R^1$ is independently at each occurrence a $C_{1-18}$ monovalent hydrocarbon radical and $R^2$ is independently at each occurrence a $C_{1-18}$ monovalent hydrocarbon radical or a hydrogen radical; and "a" is a whole number in a range of from 1 to 3 inclusive.

26. An electronic component as defined in claim 13, wherein the cured layer has a thickness in a range of from about 10 microns to about 150 microns.

* * * * *